(12) United States Patent
Chiu (10) Patent No.: US 6,908,787 B2
(45) Date of Patent: Jun. 21, 2005

(54) SYSTEM AND METHOD FOR INCREASING THE STRENGTH OF A BOND MADE BY A SMALL DIAMETER WIRE IN BALL BONDING

(75) Inventor: Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/611,578

(22) Filed: Jul. 1, 2003

(65) Prior Publication Data

US 2005/0003584 A1 Jan. 6, 2005

(51) Int. Cl.⁷ .............................................. H01L 21/44
(52) U.S. Cl. ...................... 438/106; 438/108; 438/109; 438/125
(58) Field of Search ................................ 438/106, 108, 438/109, 125

(56) References Cited

U.S. PATENT DOCUMENTS 6,478,212 B1 * 11/2002 Engel et al. ................. 228/5.7
6,555,440 B1    4/2003 Geefay

FOREIGN PATENT DOCUMENTS

| JP | 11297746   | 10/1999 |
|----|------------|---------|
| JP | 2002246411 | 8/2002  |

* cited by examiner

Primary Examiner—Michael Tran
Assistant Examiner—Renee R. Berry
(74) Attorney, Agent, or Firm—Lisa K. Jorgenson; William A Munck (57) ABSTRACT

A system and method is disclosed for increasing the strength of a bond made by a small diameter wire in ball bonding. In one embodiment of the invention a structure for receiving a ball bond comprises substrate material that has portions that form a substrate cavity and a wire bond pad that covers and fills the substrate cavity. The wire bond pad also has portions that form a wire bond cavity for receiving the ball bond. The ball is wirebonded to the sides and bottom of the wire bond cavity. The sides of the wire bond cavity provide additional strength to the bond to resist shear and tensile forces that may act on the wire.

12 Claims, 8 Drawing Sheets

SYSTEM AND METHOD FOR INCREASING THE STRENGTH OF A BOND MADE BY A SMALL DIAMETER WIRE IN BALL BONDING

TECHNICAL FIELD OF THE INVENTION

The present invention is directed, in general, to integrated circuits and, more specifically, to a system and method for increasing the strength of a bond made by a small diameter wire in a ball bonding process.

BACKGROUND OF THE INVENTION

Wirebonding is a well known electrical interconnection technique used in the manufacture of integrated circuits and other microelectronic structures. For example, the input/output (I/O) wires of an integrated circuit chip may be wirebonded to their respective wire bond pads on the integrated circuit chip.

Wirebonding is a solid phase welding process that welds the metallic material of a wire to the metallic material of a corresponding wire bond pad. After a wire and a wire bond pad are placed in contact, the wire and the wire bond pad may be welded together using a well known process such as a thermocompression process, an ultrasonic process, or a thermosonic process.

There are two basic forms of wirebond. They are the ball bond form and the wedge bond form. Ball bonding and wedge bonding are both well known in the wirebonding art. The most commonly used elements used to make bonding wire are gold, aluminum, and copper. Gold, aluminum, and copper are strong, ductile, flexible, reliable, and have similar values of electrical resistance. Gold wire bonding is the most widely used wirebonding technology in the integrated circuit industry.

Figure 1:
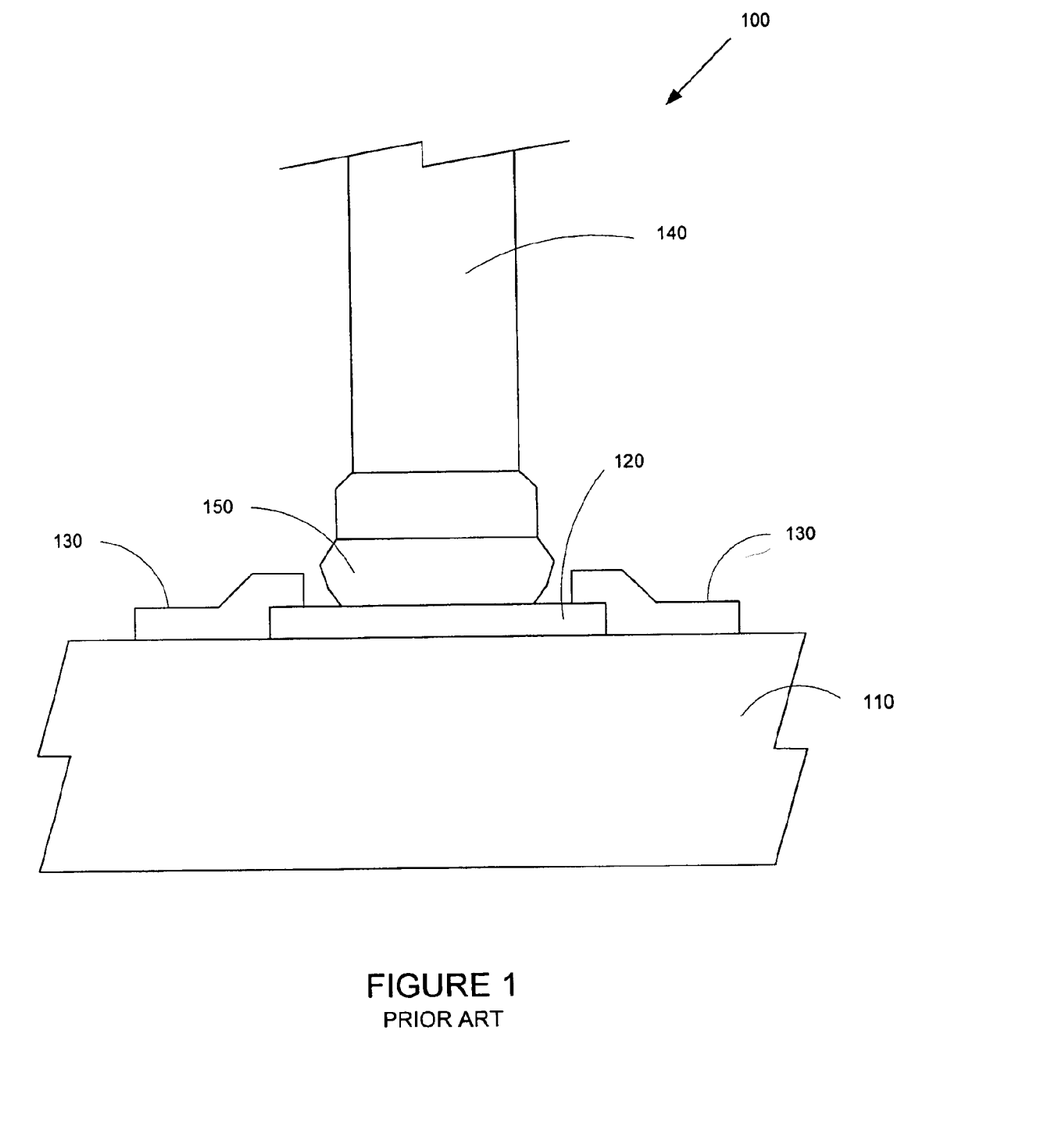
FIG. 1 illustrates a cross sectional view of a prior art wire bond pad and a prior art ball bond of a wire bonded to the prior art wire bond pad.

FIG. 1 illustrates a cross sectional view 100 of a prior art wire bond pad 120 and a prior art ball bond 150 of wire 140 bonded to the wire bond pad 120. Wire bond pad 120 is made of a metal conductor such as aluminum or copper. During the process of fabrication, wire bond pad 120 is placed on substrate material 110 (e.g., silicon). The edges of wire bond pad 120 are then covered with passivation material 130. A central portion of the external surface of wire bond pad 120 is open to receive ball 150 on the end of wire 140. Ball 150 is placed on wire bond pad 120 and bonded to wire bond pad 120 using a prior art wirebonding technique.

Integrated circuit designers continue to increase the number of functions that integrated circuits are capable of performing. The increased number of integrated circuit functions has also increased the number of input/output (I/O) wires that must be connected to an integrated circuit. An increase in the number of input/output (I/O) wires for an integrated circuit die also increases the area of an integrated circuit die that must be allocated to the attachment sites for the input/output (I/O) wires.

It is desirable to minimize the amount of area of the integrated circuit die that must be allocated to the attachment sites for the input/output (I/O) wires. One possible approach is to (1) reduce the size of the wire bond pads on the integrated circuit die, and (2) reduce the size of the diameters of the input/output (I/O) wires, and (3) reduce the size of the ball bond on the end of each input/output (I/O) wire.

The use of input/output (I/O) wire having smaller diameters and the use of a smaller ball bond means that there will be a smaller contact area between the ball bond and the wire bond pad. A smaller contact area between the ball bond and the wire bond pad means that the bond strength (i.e., the shear and tensile strength) between the ball bond and the wire bond pad will be lower than the bond strength of a larger ball bond and a larger wire bond pad. The lower bond strength is an undesirable feature.

There is therefore a need in the art for an improved system and method for increasing the bond strength of a bond between a ball bond of a small diameter wire and a wire bond pad in a ball bonding process for an integrated circuit chip. There is also a need in the art for an integrated circuit chip that has a plurality of wire bond pads that are capable of providing increased bond strength to a ball bond of a small diameter wire.

SUMMARY OF THE INVENTION

To address the deficiencies of the prior art, it is a primary object of the present invention to provide an improved system and method for increasing the strength of a bond made to small diameter wires in a ball bonding process.

One advantageous embodiment of the present invention comprises a structure for receiving a ball bond. The structure comprises substrate material that has portions that form a substrate cavity. The structure also comprises a wire bond pad metal that covers and fills the substrate cavity. The wire bond pad also has portions that form a wire bond cavity for receiving the ball bond. When a ball on the end of a wire is wirebonded to the sides and bottom of the wire bond cavity, the sides of the wire bond cavity provide additional strength to the bond to resist shear and tensile forces that may act on the wire.

It is an object of the present invention to provide an improved system and method for providing a structure for receiving a wire bond.

It is also an object of the present invention to provide an improved system and method for increasing the strength of a bond made to small diameter wires in a ball bonding process.

It is another object of the present invention to provide an improved system and method for providing a structure for receiving a wire bond in which the structure resists shear and tensile forces that may act on the bond, the interface between the wire and the wire bond pad.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the Detailed Description of the Invention below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses, of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented for any suitably arranged integrated circuit.

The system and method of the present invention provides increased bond strength between a ball bond of a small diameter wire and a wire bond pad in a ball bonding process for an integrated circuit chip.

FIG. 1 illustrates a cross sectional view 100 of a prior art wire bond pad 120 and a prior art ball bond 150 of wire 140 bonded to the prior art wire bond pad 120. The features of prior art wire bond pad 120 have been previously discussed. Prior art wire bond pad 120 is flat. Prior art wire bond pad is placed on the surface of substrate material 110.

Figure 2:
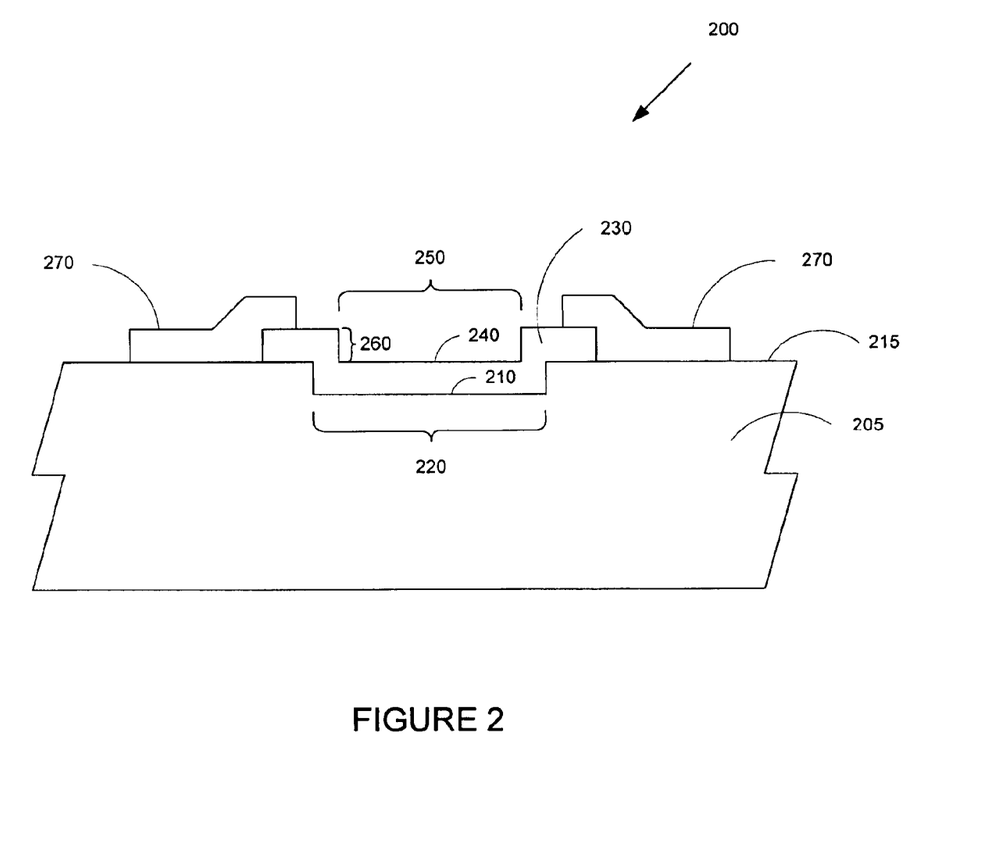
FIG. 2 illustrates a cross sectional view of an advantageous embodiment of a first type of wire bond pad in accordance with the principles of the present invention.

FIG. 2 illustrates a cross sectional view of an advantageous embodiment 200 of a wire bond pad 230 in accordance with the principles of the present invention. Substrate material 205 is formed having a substrate cavity 210 formed within the surface 215 of substrate material 205. In one advantageous embodiment the shape of substrate cavity 210 is a circle having a diameter 220. Other shapes for substrate cavity 210 may also be used.

During the process of fabrication, wire bond pad 230 is placed on the surface 215 of substrate material 205 over substrate cavity 210. The portions of wire bond pad 230 placed over substrate cavity 210 fill in substrate cavity 210. As shown in FIG. 2, the portions of wire bond pad 230 that fill in substrate cavity 210 form a wire bond cavity 240 in the surface of wire bond pad 230. In one advantageous embodiment the shape of wire bond cavity 240 is a cylinder having diameter 250 and depth 260. Other shapes for wire bond cavity 240 may also be used.

The edges of wire bond pad 230 are then covered with passivation material 270. A central portion of the external surface of wire bond pad 230 is open to receive a ball bond on the end of a wire.

Figure 3:
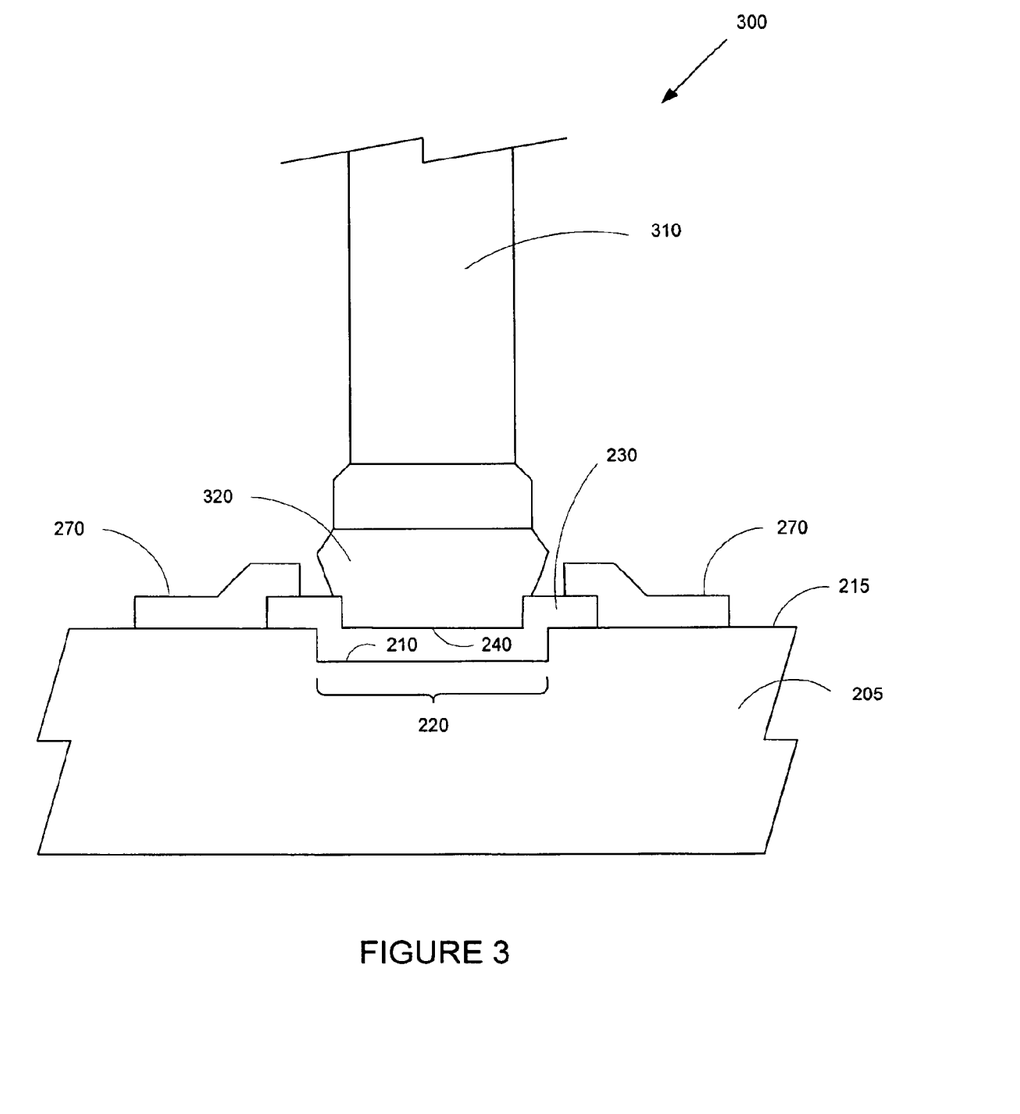
FIG. 3 illustrates a cross sectional view of a wire bonded to the first type of wire bond pad of the present invention shown in FIG. 2.

FIG. 3 illustrates a cross sectional view 300 of a wire 310 bonded to wire bond pad 230. Ball 320 is placed on wire bond pad 230 and wirebonded to wire bond pad 230 using a prior art wirebonding technique. Portions of ball 320 fill wire bond cavity 240 and are bonded to the sides and bottom of wire bond cavity 240. This increases the bond area (and increases the bond strength) between ball 320 and wire bond pad 230. The sides of wire bond cavity 240 provide additional strength to resist shear forces that may act on wire 310. The increase in bond area also increases the tensile strength of the bond in direct proportion.

In addition, the portions of wire bond pad 230 that are located within substrate cavity 210 of substrate material 205 (i.e., below the surface 215 of substrate material 205) also increase the overall bond strength between wire 310 and substrate material 205. The portions of wire bond pad 230 that fill substrate cavity 210 are bonded to the sides and bottom of substrate cavity 210. This increases the bond area (and increases the bond strength) between wire bond pad 230 and substrate material 205. The sides of substrate cavity 210 provide additional strength to resist shear forces that may act on wire 310.

Wire bond pad 230 of the present invention provides a bond strength for wire 310 that is greater than the bond strength that prior art wire bond pad 120 is able to provide to wire 140. This enables smaller diameter wires (and smaller diameter wire bond pads) to be used.

Figure 4:
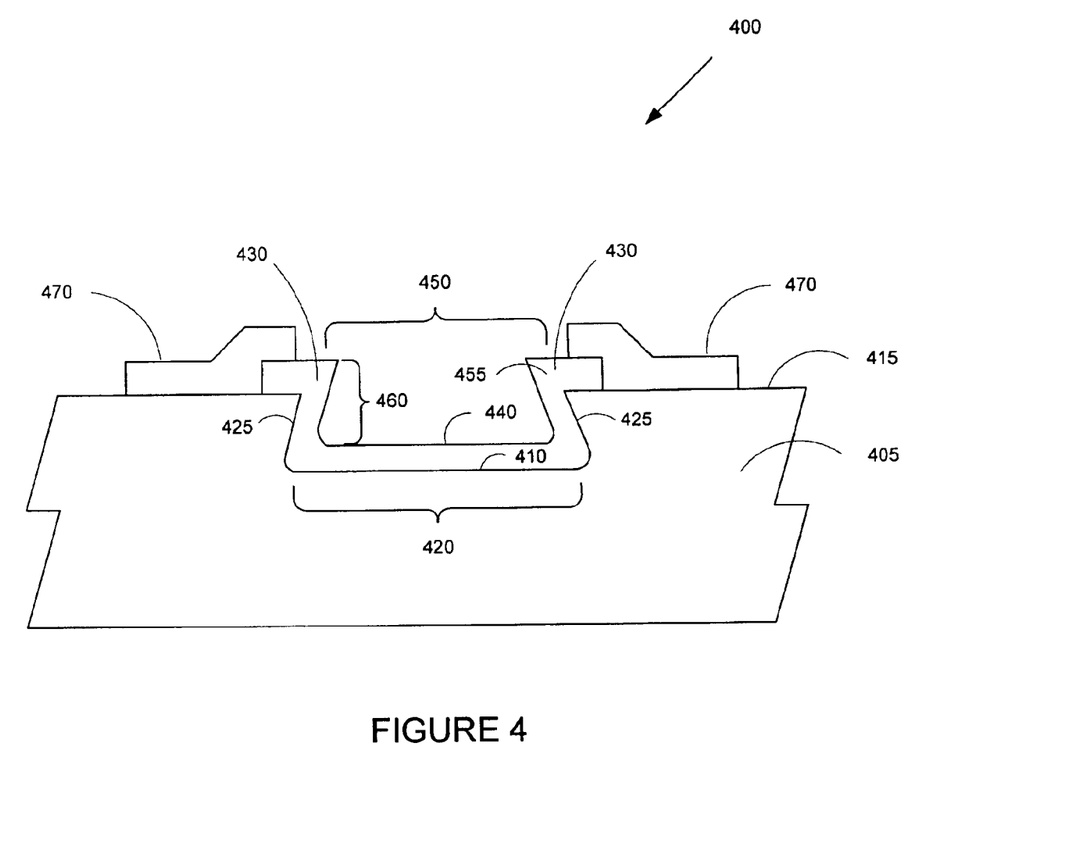
FIG. 4 illustrates a cross sectional view of an advantageous embodiment of a second type of wire bond pad in accordance with the principles of the present invention.
Figure 5:
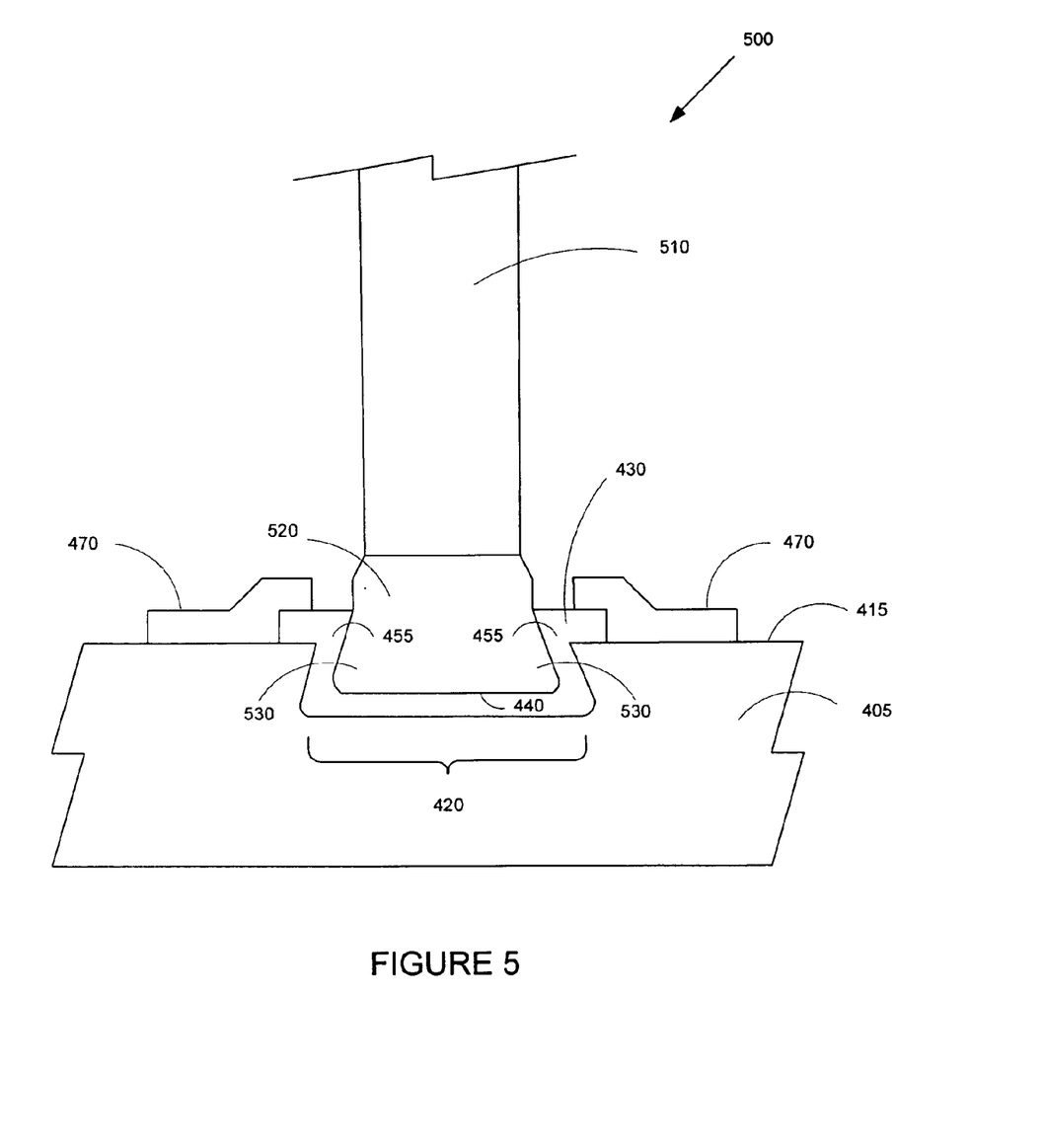
FIG. 5 illustrates a cross sectional view of a wire bonded to the second type of wire bond pad of the present invention shown in FIG. 4.

A second advantageous embodiment of the present invention is shown in FIGS. 4 and 5. The second embodiment uses a deeper substrate cavity within the substrate material than that used by the first embodiment of the invention. For this reason wire bond pad 230 may be referred to as a "shallow" wire bond pad because the depths of substrate cavity 210 and wire bond cavity 240 are relatively shallow compared to the deeper depths of the cavities of the second embodiment.

FIG. 4 illustrates a cross sectional view of a second advantageous embodiment 400 of a wire bond pad 430 in accordance with the principles of the present invention. Substrate material 405 is formed having a substrate cavity 410 formed within the surface 415 of substrate material 405. In one advantageous embodiment the shape of substrate cavity 410 is cylindrically symmetrical with the bottom of substrate cavity 410 having a diameter 420. Other shapes for substrate cavity 410 may also be used.

As shown in FIG. 4, the diameter of the bottom of substrate cavity 410 may be formed to be greater than the diameter of the top of substrate cavity 410. This forms a restraining edge 425 around the circumference of substrate cavity 410. Restraining edge 425 provides additional bond strength to any wire that is bonded to wire bond pad 430.

During the process of fabrication, wire bond pad 430 is placed on the surface 415 of substrate material 405 over substrate cavity 410. The portions of wire bond pad 430 placed over substrate cavity 410 fill in the bottom portions of substrate cavity 410. As shown in FIG. 4, the portions of wire bond pad 430 that fill in the bottom portions of substrate cavity 410 form a wire bond cavity 440 in the surface of wire bond pad 430.

In one advantageous embodiment the shape of wire bond cavity 440 is cylindrically symmetrical having a depth 460 and a bottom diameter 450. Other shapes for wire bond cavity 440 may also be used. The diameter 450 of the bottom of wire bond cavity 440 is greater than the diameter of the top of wire bond cavity 440. The portions of wire bond pad 430 that cover restraining edge 425 form a restraining edge 455 around the circumference of wire bond cavity 440. Restraining edge 455 provides additional bond strength to any wire that is bonded to wire bond pad 430.

The edges of wire bond pad 430 are then covered with passivation material 470. Wire bond cavity 440 in the central portion of wire bond pad 430 is open to receive a ball bond on the end of a wire.

FIG. 5 illustrates a cross sectional view 500 of a wire 510 bonded to wire bond pad 430. Ball 520 is placed on wire bond pad 430 and wirebonded to wire bond pad 430 using a prior art wirebonding technique. Portions of ball 520 fill wire bond cavity 440 and are bonded to the sides and bottom of wire bond cavity 440. This increases the bond area (and increases the bond strength) between ball 520 and wire bond pad 430. The sides of wire bond cavity 440 provide additional strength to resist shear forces that may act on wire 510. The sides of wire bond cavity 440 also provide additional tensile strength to the bond.

In addition, the portions of wire bond pad 430 that are located within substrate cavity 410 of substrate material 405 (i.e., below the surface 415 of substrate material 405) also increase the overall bond strength between wire 510 and substrate material 405. The portions of wire bond pad 430 that fill substrate cavity 410 are bonded to the sides and bottom of substrate cavity 410. This increases the bond area (and increases the bond strength) between wire bond pad 430 and substrate material 405. The sides of substrate cavity 410 provide additional strength to resist shear forces that may act on wire 510.

The portions of ball 520 that fill wire bond cavity 440 under restraining edge 455 of wire bond cavity 440 form a restraining wedge 530. Restraining wedge 530 engages restraining edge 455 of wire bond pad 430 to provide additional bond strength to the bond between wire 510 and wire bond pad 430.

Wire bond pad 430 of the present invention provides a bond strength for wire 510 that is greater than the bond strength that prior art wire bond pad 120 is able to provide to wire 140. This enables smaller diameter wires (and smaller diameter wire bond pads) to be used.

Wire bond pad 430 forms a wire bond cavity 440 that is deeper than wire bond cavity 240 of wire bond pad 230. For this reason wire bond pad 430 may be referred to as a "deep" wire bond pad and wire bond pad 230 may be referred to as a "shallow" wire bond pad. It is understood that cavities of varying depths may be used in practicing the present invention. The shallow wire bond pad 230 and the deep wire bond pad 430 are examples of advantageous embodiments of the present invention.

Figure 6:
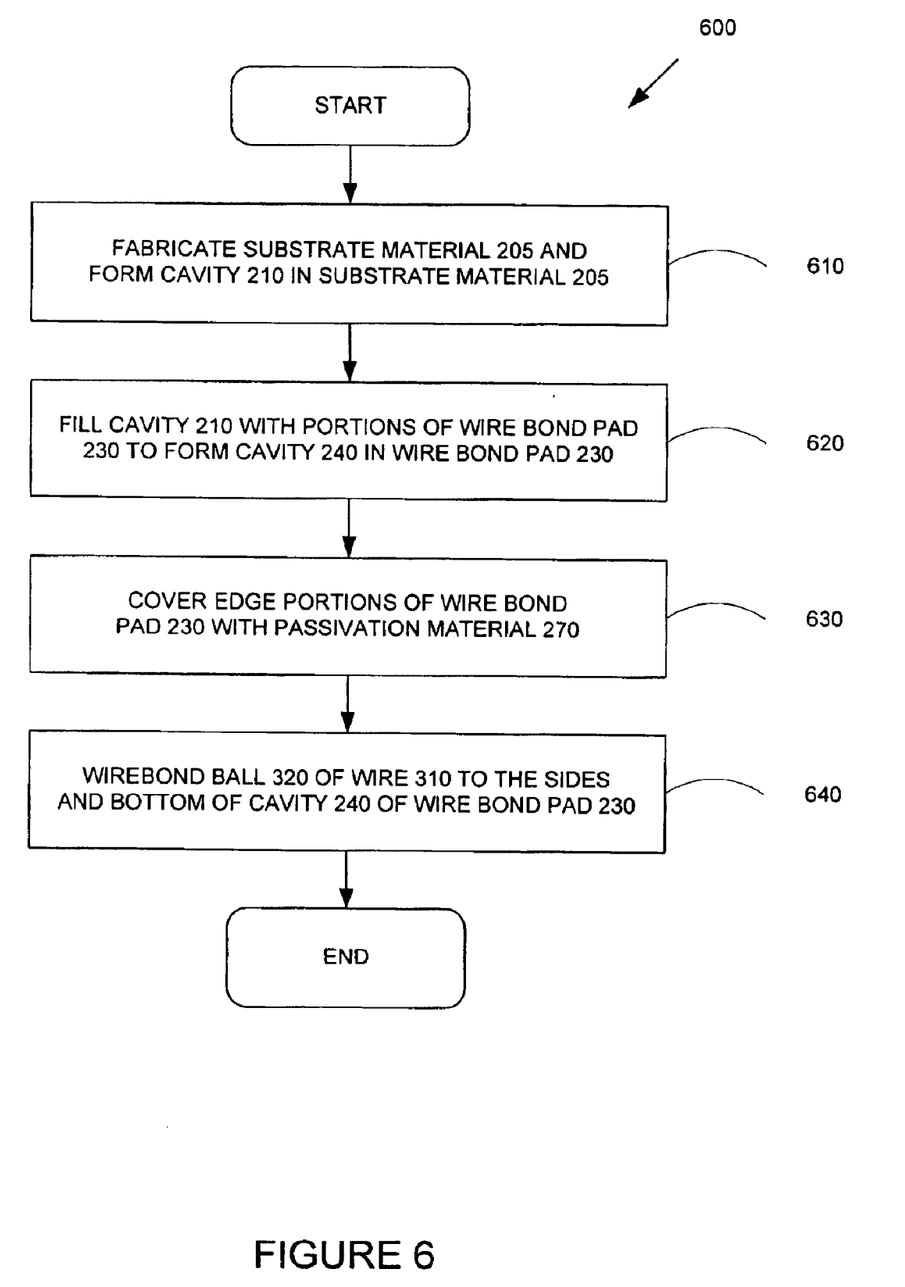
FIG. 6 illustrates a flow chart of an advantageous embodiment of a method of the present invention for making a first type of wire bond pad for use in an integrated circuit.

FIG. 6 illustrates a flow chart of an advantageous embodiment of a method of the present invention for making and using a first type of wire bond pad for an integrated circuit. The steps of the method are generally denoted with reference numeral 600.

The first step is to fabricate substrate material 205 and form substrate cavity 210 in an external surface 215 of substrate material 205 (step 610). Substrate cavity 210 is then filled with portions of wire bond pad 230 to form wire bond cavity 240 in wire bond pad 230 (step 620).

Then the edge portions of wire bond pad 230 are covered with passivation material 270 (step 630). Then ball 320 of wire 310 is wirebonded to the sides and bottom of cavity 240 (step 640).

Figure 7:
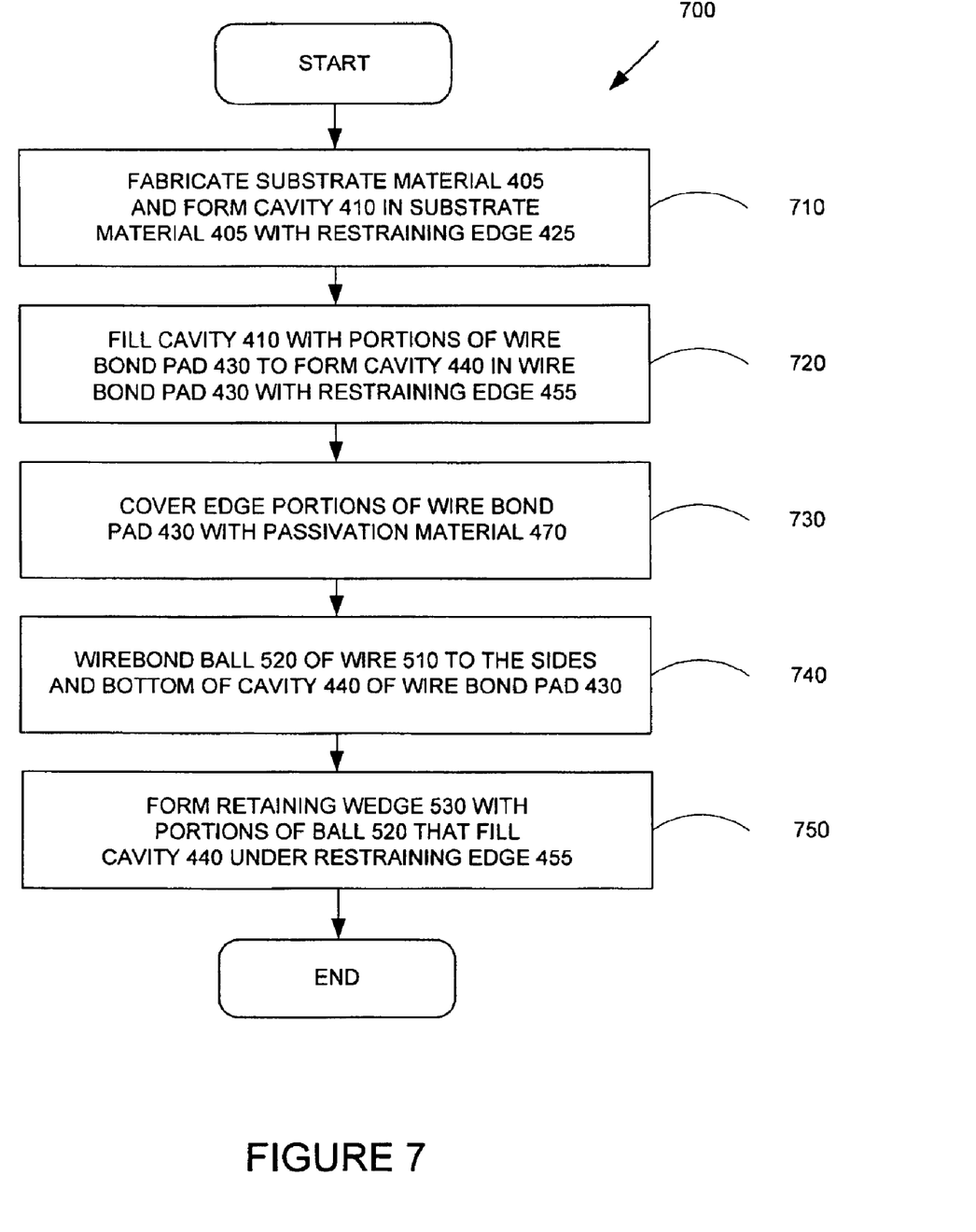
FIG. 7 illustrates a flow chart of an advantageous embodiment of a method of the present invention for making a second type of wire bond pad for use in an integrated circuit.

FIG. 7 illustrates a flow chart of an advantageous embodiment of a method of the present invention for making and using a second type of wire bond pad for an integrated circuit. The steps of the method are generally denoted with reference numeral 700.

The first step is to fabricate substrate material 405 and form substrate cavity 410 in an external surface 415 of substrate material 405 with restraining edge 425 (step 710). Substrate cavity 410 is then filled with portions of wire bond pad 430 to form wire bond cavity 440 in wire bond pad 430 (step 720).

Then the edge portions of wire bond pad 430 are covered with passivation material 470 (step 730). Then ball 520 of wire 510 is wirebonded to the sides and bottom of cavity 440 (step 740). A retaining wedge 530 is formed with the portions of ball 520 that fill cavity 440 under restraining wedge 455 (step 750).

Figure 8:
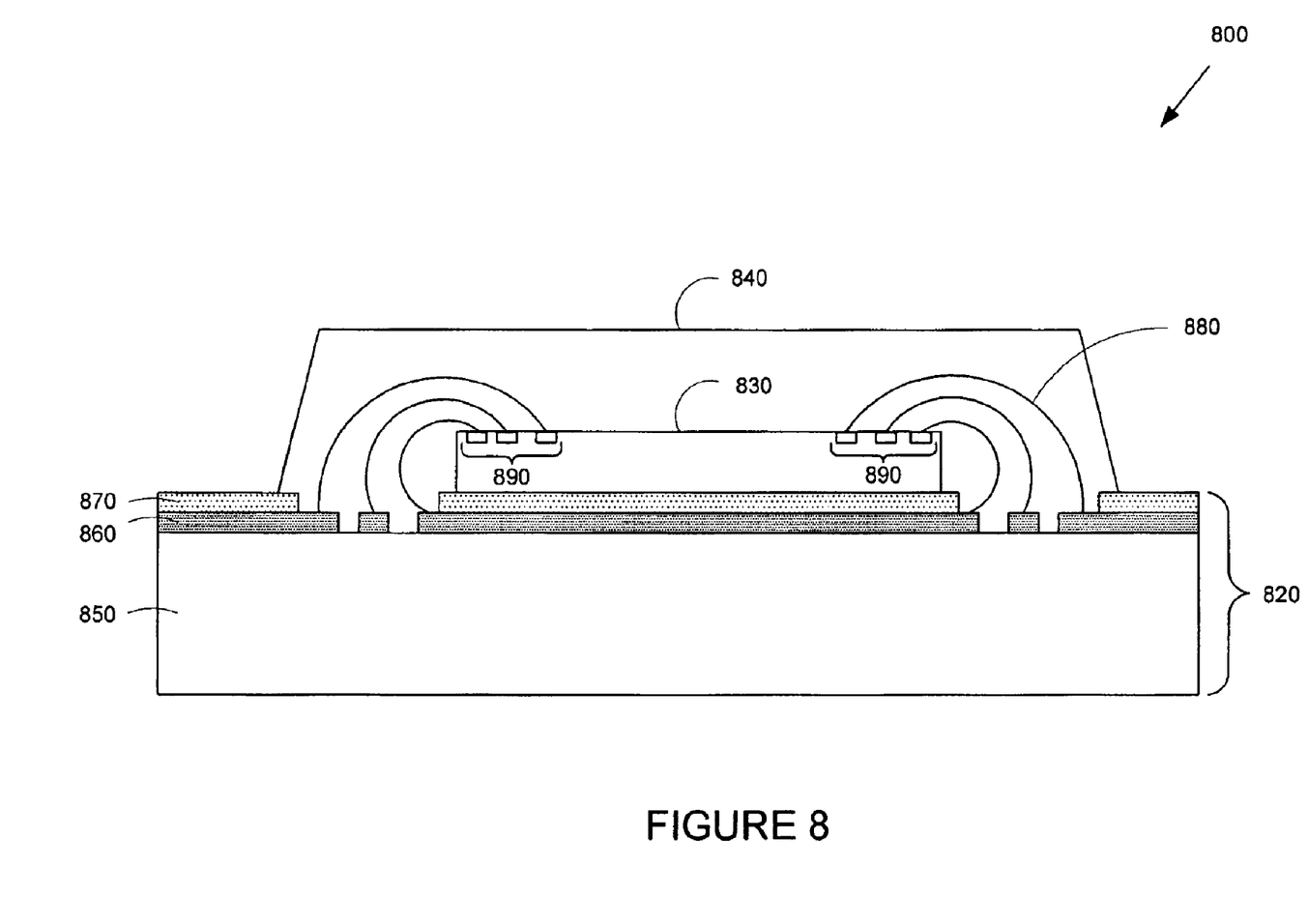
FIG. 8 illustrates a sectional side view of an exemplary integrated circuit package manufactured in accordance with the principles of the present invention.

FIG. 8 illustrates how the wire bond pads of the present invention may be used in an integrated circuit package. FIG. 8 illustrates a sectional side view of an exemplary integrated circuit package 800 manufactured in accordance with the principles of the present invention. Integrated circuit package 800 comprises substrate 820, integrated circuit die 830, and protective material 840. Substrate 820 comprises core layer 850, metal layer 860, and dielectric layer 870. As shown in FIG. 8, electrical leads 880 connect integrated circuit die 830 with metal layer 860. The ends of the electrical leads 880 are bonded to a plurality of wire bond pads 890 of the present invention.

Consider a prior art ball bonding process in which the diameter of a wire bond pad opening is one hundred microns (100 $\mu$m). A micron is one millionth of a meter ($10^{-6}$ m). Therefore, one hundred microns (100 $\mu$m) is one ten thousandth ($10^{-4}$ m) of a meter. The diameter of a typical prior art wire that is bonded to a one hundred micron (100 $\mu$m) wire bond pad opening ranges from twenty five microns (25 $\mu$m) to thirty two microns (32 $\mu$m).

If the diameter of the wire bond pad opening is reduced to fifty microns (50 $\mu$m), the diameter of the wire may be reduced to approximately twenty microns (20 $\mu$m). The strength of the bond between the smaller diameter of the twenty micron (20 $\mu$m) wire and the fifty micron (50 $\mu$m) wire bond pad opening will be weaker than the bond for a larger diameter wire because of the reduced area of contact of the twenty micron (20 $\mu$m) wire.

By employing the principles of the present invention, it is possible to reduce the diameter of the wire bond pad opening to approximately thirty microns (30 µm) and still use a wire that has a twenty micron (20 µm) diameter. The increased bond strength that is provided by the structure of the present invention wire makes it possible to use wires that have a diameter that is only slightly smaller than the diameter of the wire bond pad opening. The diameter of the wire of the present invention may be smaller than the diameter of the wire bond pad opening by five percent (5%) to twenty percent (20%).

The wires and wire bond pads have been described above as having cylindrical symmetry (i.e., having a circular cross-section). However, in alternative embodiments, the wires and wire bond pads may be constructed with other cross-sectional shapes (oval, square, rectangular, irregular, etc.) if required for a particular application.

Although the present invention has been described in detail, those skilled in the art will understand that various changes, substitutions, and alterations herein may be made without departing from the spirit and scope of the invention it its broadest form.

What is claimed is:

1. A method for fabricating a structure for receiving a wire bond, said method comprising the steps of:
    fabricating a substrate material having portions that form a substrate cavity within said substrate material;
    filling said substrate cavity with portions of a wire bond pad to form a wire bond cavity in said wire bond pad; and
    covering edge portions of said wire bond pad with passivation material.

2. The method as set forth in claim 1 further comprising the step of:
    fabricating said wire bond cavity with portions that form at least one side of said wire bond cavity.

3. The method as set forth in claim 1 further comprising the step of:
    fabricating said wire bond cavity with portions that form a wire bond cavity having a cross sectional shape that is one of: circular, oval, square, rectangular and irregular.

4. A method of wirebonding a wire to a structure for receiving a wire bond, said method comprising the steps of:
    fabricating a substrate material having portions that form a substrate cavity within said substrate material;
    filling said substrate cavity with portions of a wire bond pad to form a wire bond cavity in said wire bond pad;
    covering edge portions of said wire bond pad with passivation material; and
    wirebonding a ball on an end of said wire to said wire bond cavity.

5. The method as set forth in claim 4 further comprising the step of:
    fabricating said wire bond cavity with portions that form at least one side of said wire bond cavity.

6. The method as set forth in claim 4 further comprising the step of:
    fabricating said wire bond cavity with portions that form a wire bond cavity having a cross sectional shape that is one of: circular, oval, square, rectangular and irregular.

7. A method for fabricating a structure for receiving a wire bond, said method comprising the steps of:
    fabricating a substrate material having portions that form a substrate cavity within said substrate material and that form a restraining edge of substrate material around said substrate cavity;
    filling said substrate cavity with portions of a wire bond pad to form a wire bond cavity in said wire bond pad, wherein said wire bond pad has portions that form a restraining edge around said wire bond cavity; and
    covering edge portions of said wire bond pad with passivation material.

8. The method as set forth in claim 7 further comprising the step of:
    fabricating said wire bond cavity with portions that form at least one side of said wire bond cavity.

9. The method as set forth in claim 7 further comprising the step of:
    fabricating said wire bond cavity with portions that form a wire bond cavity having a cross sectional shape that is one of: circular, oval, square, rectangular and irregular.

10. A method of wirebonding a wire to a structure for receiving a wire bond, said method comprising the steps of:
    fabricating a substrate material having portions that form a substrate cavity within said substrate material and that form a restraining edge of substrate material around said substrate cavity;
    filling said substrate cavity with portions of a wire bond pad to form a wire bond cavity in said wire bond pad, wherein said wire bond pad has portions that form a restraining edge around said wire bond cavity;
    covering edge portions of said wire bond pad with passivation material; and
    wirebonding a ball on an end of said wire to said wire bond cavity, wherein portions of said ball that fill said wire bond cavity under said restraining edge around said wire bond cavity form a restraining wedge.

11. The method as set forth in claim 10 further comprising the step of:
    fabricating said wire bond cavity with portions that form at least one side of said wire bond cavity.

12. The method as set forth in claim 10 farther comprising the step of:
    fabricating said wire bond cavity with portions that form a wire bond cavity having a cross sectional shape that is one of: circular, oval, square, rectangular and irregular.

* * * * *